US009684748B1

United States Patent
Badel et al.

(10) Patent No.: US 9,684,748 B1
(45) Date of Patent: Jun. 20, 2017

(54) SYSTEM AND METHOD FOR IDENTIFYING AN ELECTRICAL SHORT IN AN ELECTRONIC DESIGN

(71) Applicant: Cadence Design Systems, Inc., San Jose, CA (US)

(72) Inventors: Olivier Badel, Mandelieu (FR); Gerard Tarroux, Villeneuve-Loubet (FR); Nicolas Hadacek, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 236 days.

(21) Appl. No.: 14/576,765

(22) Filed: Dec. 19, 2014

(51) Int. Cl.
*G06F 17/50* (2006.01)
(52) U.S. Cl.
CPC ...... *G06F 17/5045* (2013.01); *G06F 17/5009* (2013.01)
(58) Field of Classification Search
CPC ............. G06F 17/5045; G06F 17/5068; G06F 17/5077; G06F 17/5081
USPC .......................... 716/106, 110–111, 119, 126
See application file for complete search history.

(56) References Cited

U.S. PATENT DOCUMENTS

| 6,263,480 B1 * | 7/2001 | Bartels | G06F 17/5077 716/112 |
| 2003/0071632 A1 * | 4/2003 | Indermaur | G01R 31/2853 324/512 |

* cited by examiner

*Primary Examiner* — Paul Dinh
(74) *Attorney, Agent, or Firm* — Mark H. Whittenberger, Esq.; Holland & Knight LLP

(57) ABSTRACT

The present disclosure relates to a computer-implemented method for electronic design automation. The method may include providing, using one or more computing devices, an electronic design including a first net and a second net. The method may include identifying a shortest path between the first net and the second net and determining at least one common shape associated with the shortest path. The method may also include identifying one or more adjacent shapes to the at least one common shape and identifying at least one fork associated with each of the one or more connectivity reference points. The method may further include analyzing an intermediate fork of the at least one fork to identify an electrical short associated with the electronic design.

20 Claims, 17 Drawing Sheets

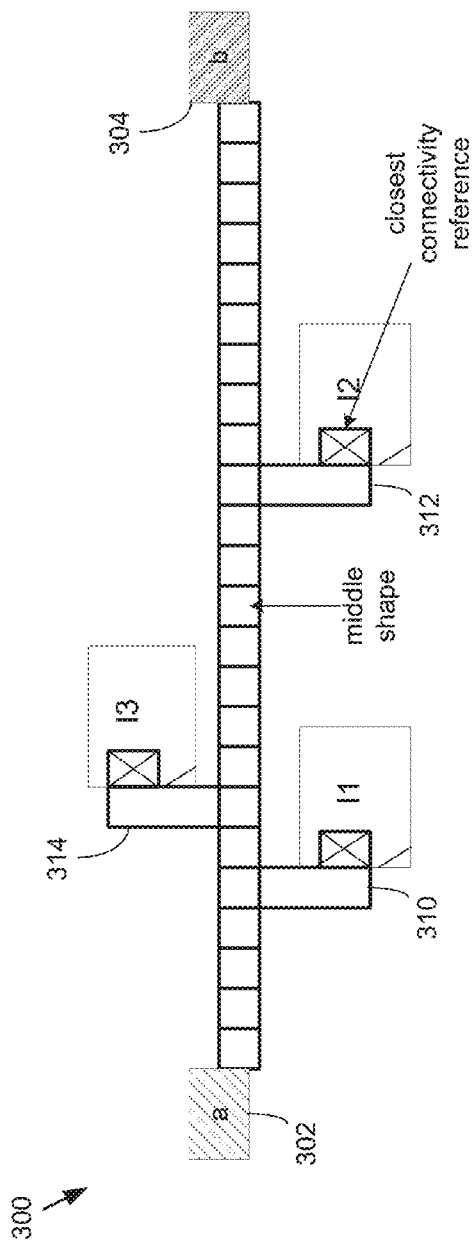
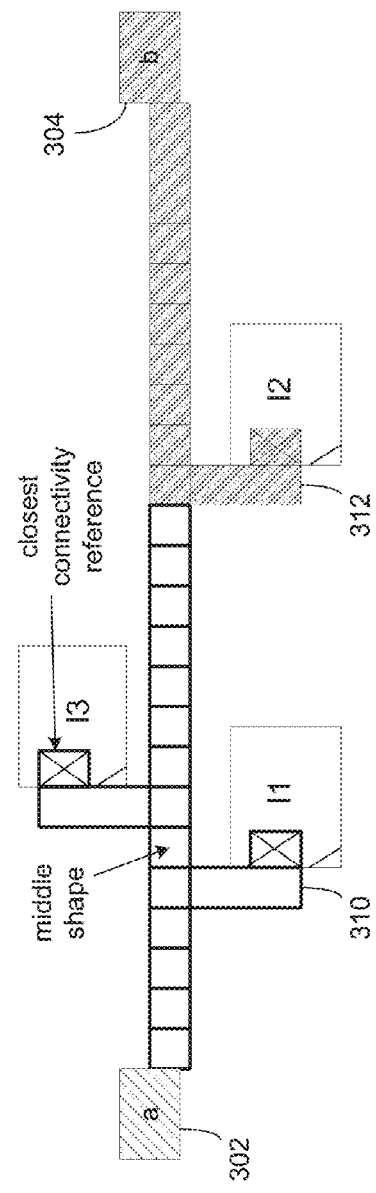

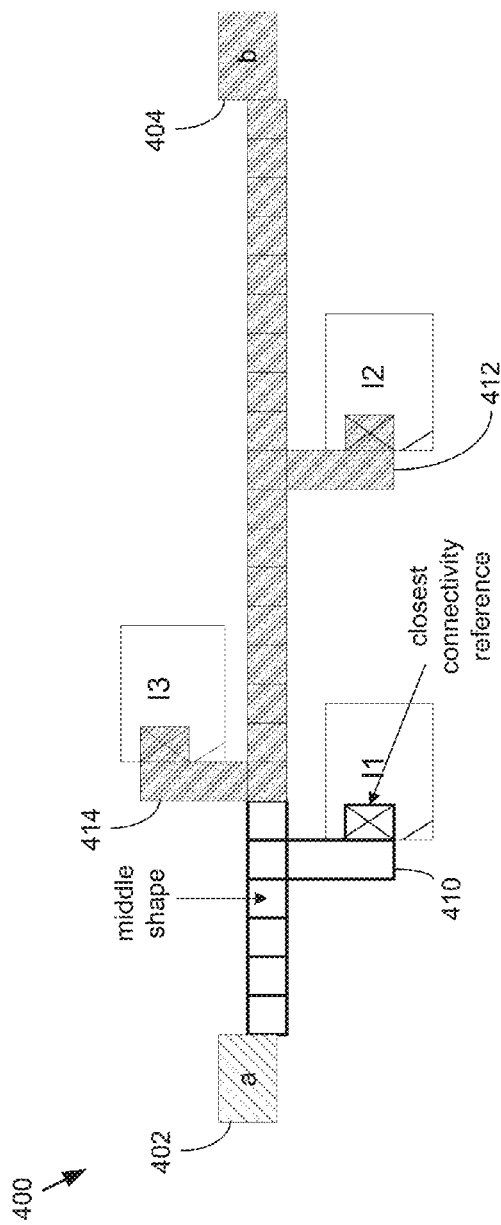
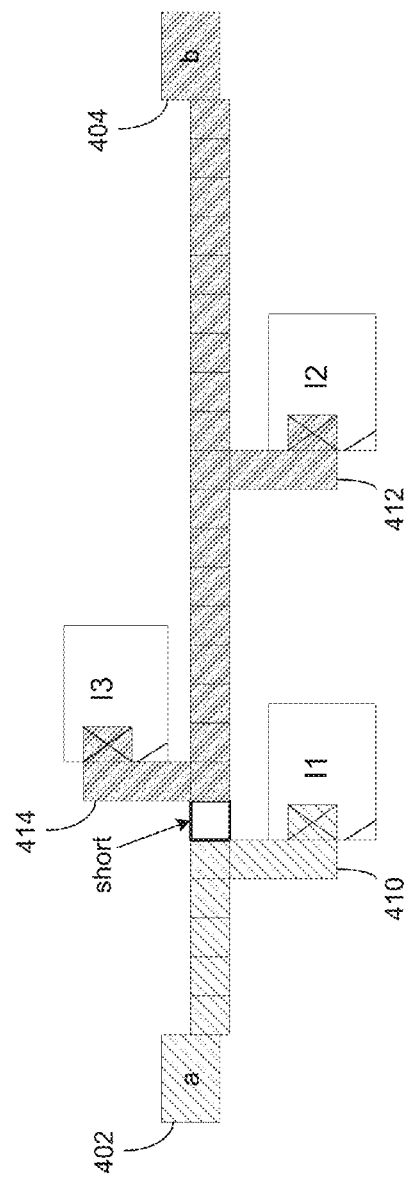
FIG. 4A
FIG. 4B

1600

| Forks | Net |
|---|---|
| Pin | VDD |
| Fork #1 | VDD |
| ∟ Inst1.TermA | VDD |
| Fork #2 | |
| ├ Inst2.TermA | |
| ∟ Inst3.TermB | |
| ... | |
| Fork #10 | |
| ∟ Inst4.TermB | |
| Pin | VSS |

SYSTEM AND METHOD FOR IDENTIFYING AN ELECTRICAL SHORT IN AN ELECTRONIC DESIGN

FIELD OF THE INVENTION

The present disclosure relates to electronic design automation, and more specifically, to a method for identifying an electrical short in an electronic design.

DISCUSSION OF THE RELATED ART

Electronic design automation (EDA) utilizes software tools that may be used in the design and analysis of numerous electronic systems such as printed circuit boards (PCBs) and integrated circuits (ICs). Verification environments include constraints that describe the relationship between the variables that control the simulation (and sometimes the data that is used as well). For example, in order to verify certain IC designs many simulations are run, which may verify different aspects of the design being tested. Each test may run for a certain amount of design time (usually measured in clock cycles) and a certain amount of user time.

Finding an error responsible for causing an electrical short in a layout is a difficult task. It is typically performed during sign-off. In some cases, a list of electrically connected shapes that form a path between the two shorted nets may be available. The existing method involved determining the correct connectivity of each shape found by dichotomy. This approach is not very efficient as there can be a large number of shapes on the path. Also, finding the correct connectivity of a shape is complicated. It often involves manually following electrically-connected shapes until a device is found.

SUMMARY

In one or more embodiments of the present disclosure, a computer-implemented method is provided. The method may include providing, using one or more computing devices, an electronic design including a first net and a second net. The method may include identifying a shortest path between the first net and the second net and determining at least one common shape associated with the shortest path. The method may also include identifying one or more adjacent shapes to the at least one common shape and identifying at least one fork associated with each of the one or more connectivity reference points. The method may further include analyzing an intermediate fork of the at least one fork to identify an electrical short associated with the electronic design.

One or more of the following features may be included. In some embodiments, the at least one common shape may correspond to a device associated with the electronic design. The at least one fork may be configured to connect the one or more connectivity reference points with the shortest path. The method may further include displaying at least a portion of the electronic design in a navigator. The at least one fork may include a plurality of connectivity reference points. In some embodiments, the navigator may be configured to allow for the selection of the at least one fork. In response to the selection, the method may include visually emphasizing a path from the at least one fork to a nearest shape.

In some embodiments, a computer-readable storage medium having stored thereon instructions that when executed by a machine result in one or more operations is provided. Operations may include providing, using one or more computing devices, an electronic design including a first net and a second net. Operations may include identifying a shortest path between the first net and the second net and determining at least one common shape associated with the shortest path. Operations may also include identifying one or more adjacent shapes to the at least one common shape and identifying at least one fork associated with each of the one or more connectivity reference points. Operations may further include analyzing an intermediate fork of the at least one fork to identify an electrical short associated with the electronic design.

One or more of the following features may be included. In some embodiments, the at least one common shape may correspond to a device associated with the electronic design. The at least one fork may be configured to connect the one or more connectivity reference points with the shortest path. The method may further include displaying at least a portion of the electronic design in a navigator. The at least one fork may include a plurality of connectivity reference points. In some embodiments, the navigator may be configured to allow for the selection of the at least one fork. In response to the selection, the method may include visually emphasizing a path from the at least one fork to a nearest shape.

In one or more embodiments of the present disclosure, a system is provided. The system may include one or more processors configured to provide an electronic design including a first net and a second net and identify a shortest path between the first net and the second net. The one or more processors may be further configured to determine at least one common shape associated with the shortest path and to identify one or more adjacent shapes to the at least one common shape. The one or more processors may be further configured to identify at least one fork associated with each of the one or more connectivity reference points and to analyze an intermediate fork of the at least one fork to identify an electrical short associated with the electronic design.

One or more of the following features may be included. In some embodiments, the at least one common shape may correspond to a device associated with the electronic design. The at least one fork may be configured to connect the one or more connectivity reference points with the shortest path. The one or more processors may be further configured to display at least a portion of the electronic design in a navigator. The at least one fork may include a plurality of connectivity reference points. In some embodiments, the navigator may be configured to allow for the selection of the at least one fork.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 3A and FIG. 3B are diagrams depicting aspects of the identification process in accordance with an embodiment of the present disclosure;

FIG. 4A and FIG. 4B are diagrams depicting aspects of the identification process in accordance with an embodiment of the present disclosure;

DETAILED DESCRIPTION

Figure 1:
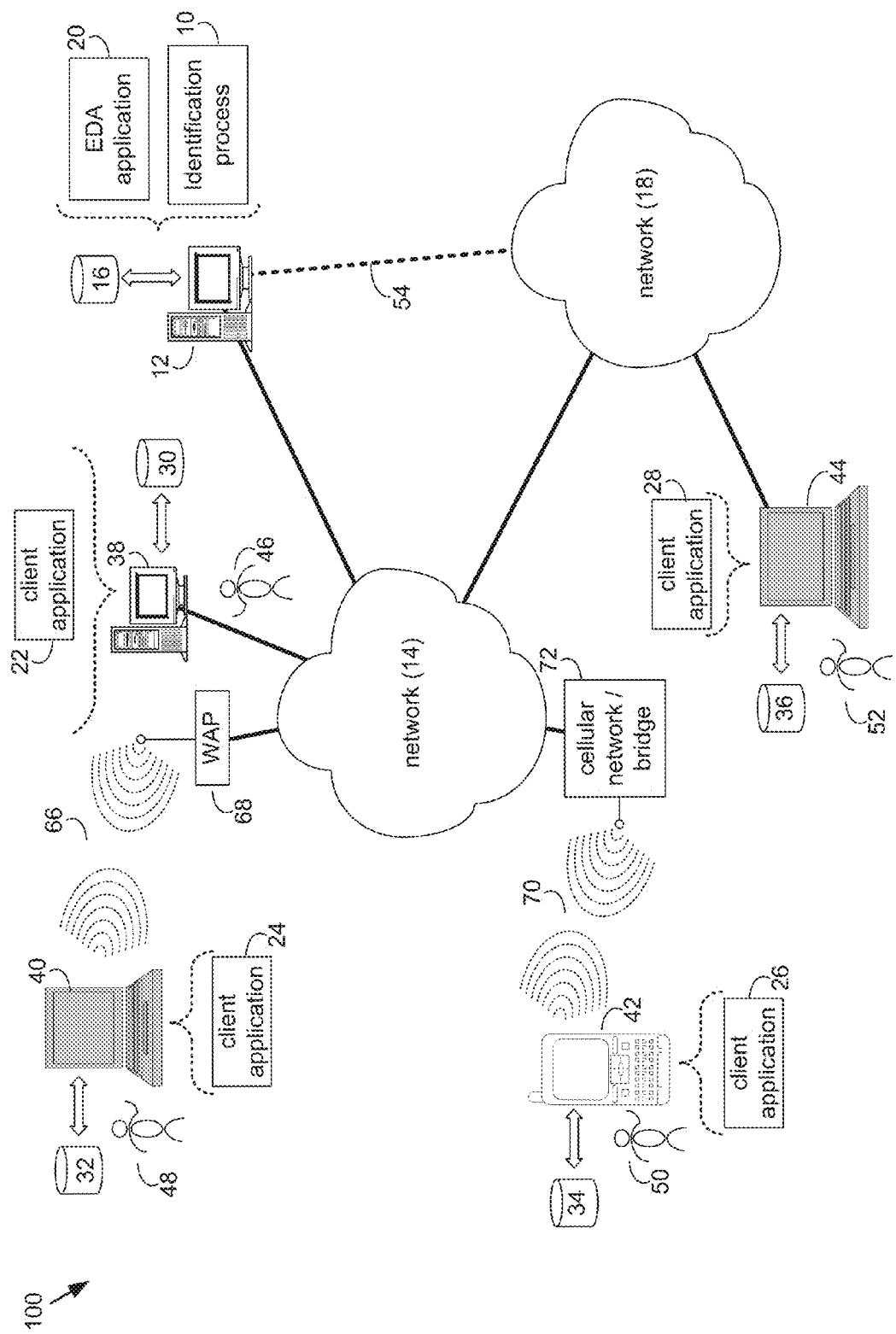
FIG. 1 is a system diagram depicting aspects of the identification process in accordance with an embodiment of the present disclosure.

Referring now to FIGS. 1-17, embodiments of the present disclosure relate to a system and method for efficiently identifying an electrical short associated with an electronic design. In many cases, a designer or the system itself may be aware of an error in the design and embodiments of the identification process 10 described herein may be used to locate the exact location of the error. Accordingly, and as is discussed in further detail below, identification process 10 may be used to automatically identify one or more forks in the path containing the short that connects to a device associated with the design (e.g. transistors, etc.). Identification process 10 may also allow for a higher level of abstraction and may provide a logical view of the connectivity as is discussed in further detail hereinbelow.

As used herein, the term "shape" may refer to a geometric shape in the layout which corresponds to a pattern of metal, oxide, or semiconductor layer. The phrase "shortest path" may refer to the set of shapes electrically connecting two points that has the smallest number of shapes. The phrase "connectivity reference point" may refer to a point that corresponds to a point with known connectivity in the electrical schema (schematic). The term "fork" may refer to a shape on a path with an adjacent shape electrically-connected to at least one connectivity reference point. The term "navigator" may refer to a graphical representation of a group of items that allows different ways for the user to display, to navigate, to select and to perform actions on these items. The term "canvas" may refer to the on-screen graphical representation of the layout. The term "layout" may refer to the representation of an integrated circuit in planar geometric shapes which correspond to the patterns of metal, oxide, or semiconductor layers that make up the components of the integrated circuit. The phrase "adjacent shape" may refer to a shape that is electrically-connected to a shape on a path and that is not on the path.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown an identification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the connection process may reside on and be executed, in whole or in part, by a client electronic device, such as a personal computer, notebook computer, personal digital assistant, or the like.

The instruction sets and subroutines of identification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Identification process 10 may be a stand alone application, or may be an applet/application/script that may interact with and/or be executed within EDA application 20. In addition/as an alternative to being a server-side process, the identification process may be a client-side process (not shown) that may reside on a client electronic device (described below) and may interact with an EDA client application (e.g., one or more of EDA client applications 22, 24, 26, 28). Further, the connection process may be a hybrid server-side/client-side process that may interact with EDA application 20 and an EDA client application (e.g., one or more of client applications 22, 24, 26, 28). As such, the connection process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize identification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
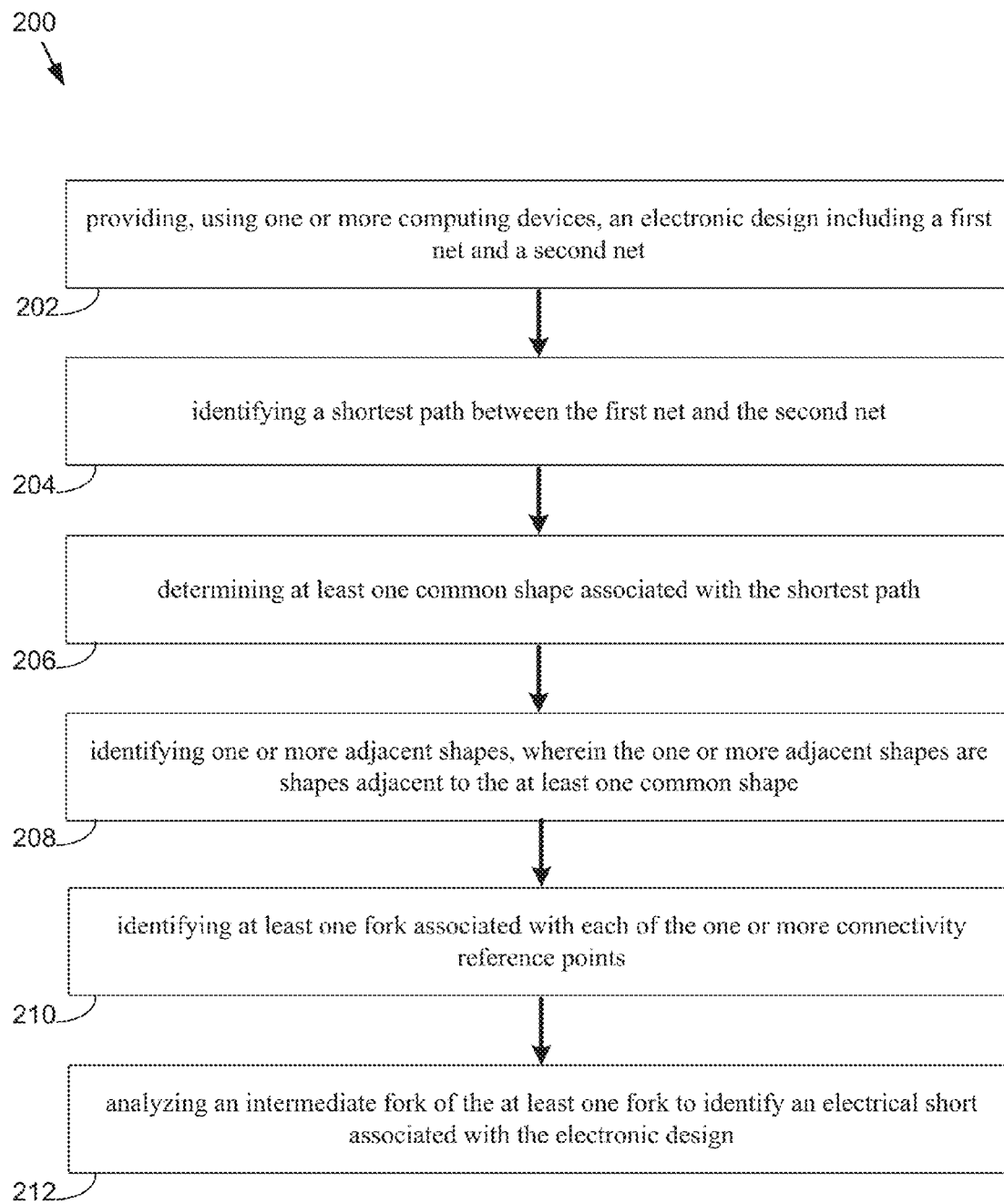
FIG. 2 is a flowchart depicting operations consistent with the identification process of the present disclosure.

Referring now to FIG. 2, an embodiment of identification process 10 is provided. The process may include providing (202), using one or more computing devices, an electronic design including a first net and a second net. The process may include identifying (204) a shortest path between the first net and the second net and determining (206) at least one common shape associated with the shortest path. The process may also identifying (208) one or more adjacent shapes to the at least one common shape and identifying (210) at least one fork associated with each of the one or more connectivity reference points. The process may further include analyzing (212) an intermediate fork of the at least one fork to identify an electrical short associated with the electronic design.

Referring also to FIG. 3A, an embodiment 300 depicting an example of a shape-based methodology for detecting a short is provided. In this particular example, a shape known on first net 302 and a shape known on second net 304 are shown in the diagram as 'a' and 'b'. When there is a short between net 'a' and net 'b', a path between a shape on 'a' and a shape on 'b' necessarily contains the shape creating the short. As shown in the Figure, the indicators "I1", "I2", and "I3" may refer to various devices in the layout (e.g. transistors, etc.). One approach that may be used to locate the error involves performing a dichotomy on the shapes of the path. The dichotomy may include begin by analyzing a listing of shapes on each net with the analysis beginning in the middle each time, as indicated by references to Middle Shape in FIGS. 3A-4A. This dichotomy on shapes can easily be applied in certain tools that provide a navigator on shapes. The number of shapes on the path can be even larger when they are sliced.

In some cases, it may not be easy to determine the connectivity of a shape. One approach may involve locating the closest top level instance terminal (e.g., connectivity reference) as is shown in FIG. 3B. Prior systems generally required that identification of the connectivity reference be performed manually. Prior systems also relied upon the identification of the middle shape (as shown in FIG. 3A) to determine what net it was located on.

Referring also to FIGS. 4A-4B, embodiments depicting the final steps of the shape-based methodology of FIGS. 3A-3B are provided. As is shown in FIGS. 3A-4B, this shape-based approach required three steps before locating the error (i.e. step 1 shown in FIG. 3A, step 2 shown in FIG. 3B, and step 3 shown in FIG. 4A, the short is identified in FIG. 4B). As such, performing a dichotomy approach on shapes may not be the fastest approach.

Referring now to FIGS. 5-10, embodiments consistent with identification process 10 are provided. In some embodiments, connection points to a top level instance terminal are analyzed. Accordingly, the connectivity of top level instance terminals may be used as the connectivity reference, which may be known from the schematic. Identification process 10 may be configured to perform dichotomy on the connection points to top level instance terminals (e.g., forks).

In some embodiments, the number of forks connected to devices may be significantly lower than the number of shapes on the path. Accordingly, a dichotomy on the forks may be faster than a dichotomy on the shapes. Additionally and/or alternatively, identification process 10 may be configured to automatically locate a connected device without requiring the manual efforts on the part of the designer.

Figure 5A:
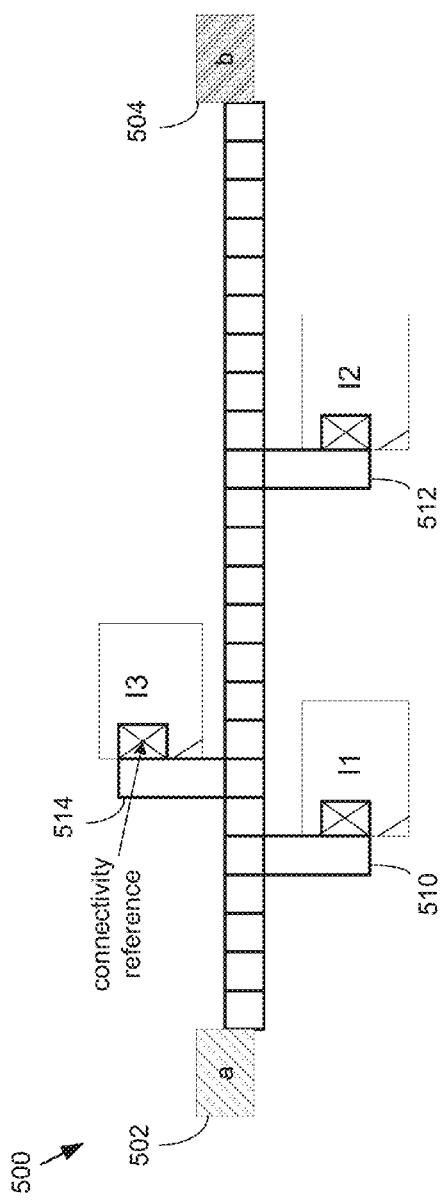
FIG. 5A and FIG. 5B are diagrams depicting aspects of the identification process in accordance with an embodiment of the present disclosure.
Figure 5B:
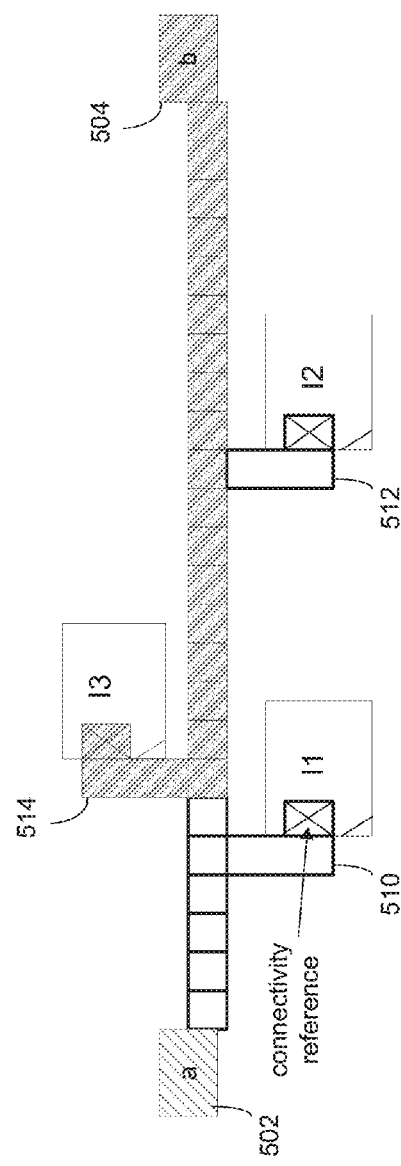
Figure 6:
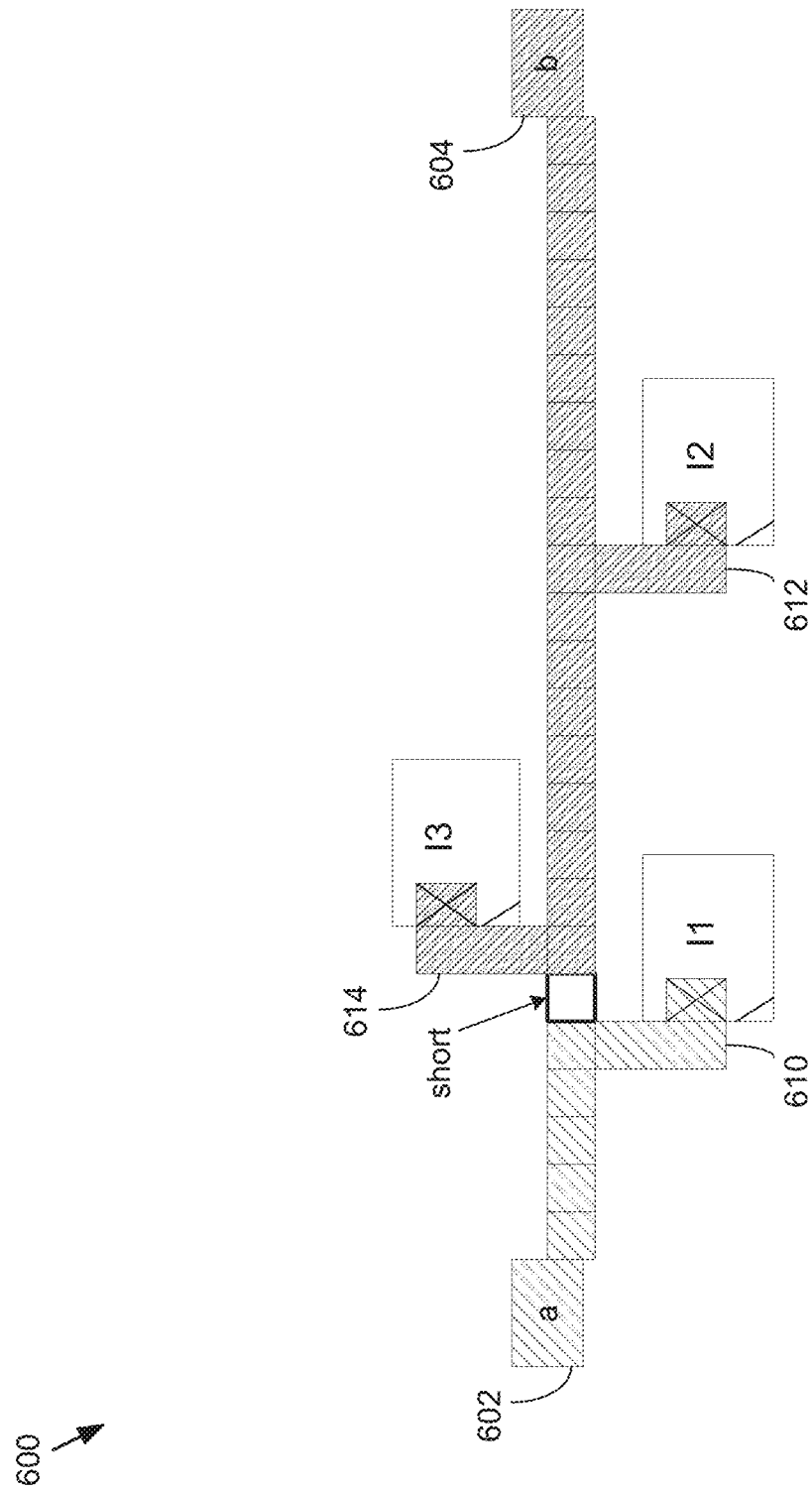
FIG. 6 is a diagram depicting aspects of the identification process in accordance with an embodiment of the present disclosure.
Figure 7:
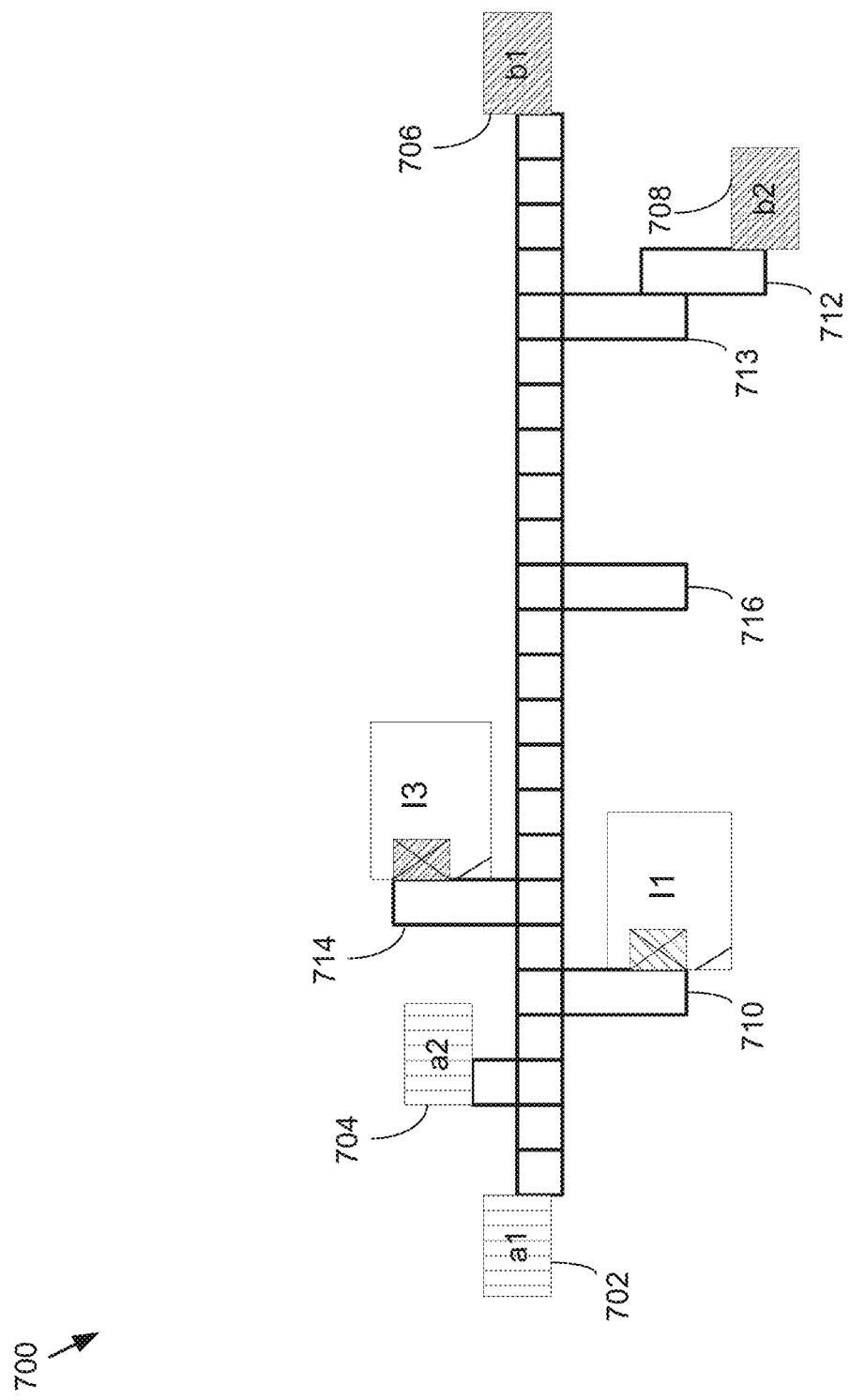
FIG. 7 is a diagram depicting aspects of the identification process in accordance with an embodiment of the present disclosure.

As shown in FIGS. 5-6, some embodiments of identification process may include analyzing the connectivity references (e.g. top level instance terminals) directly instead of the shapes. In this way, identification process 10 may analyze the connectivity references between the two nets and may identify the middle connectivity references (as opposed to the middle shape). For example, the connectivity reference points (I1, I2, and I3) are connected to the path via forks 510, 512, and 514 respectively. In some embodiments, identification process 10 may include an interface (e.g. having buttons and/or bind keys, etc.) configured to allow for navigation between the forks (e.g., first, next, middle, previous, last, etc.). In this way, the shapes of the current fork may be highlighted in the canvas. Additionally and/or alternatively, an interface may be included to assign a net to the current fork. Going to the middle fork of the forks without an assigned net would effectively do the dichotomy search. In some embodiments, identification process 10 may include a navigator with the list of forks. In addition to the example above (i.e., buttons and bind keys) the user could select a fork directly in the navigator and it would be highlighted in the canvas.

Accordingly, identification process 10 may be configured to identify one or more forks in order to identify the associated connectivity reference point. FIGS. 5-6 show that identification process 10 may require only two operations in order to locate the error (in contrast to the three shown in FIGS. 4A-4B).

In some embodiments, identification process 10 may be configured to locate the shortest paths between the pins and labels of one or more nets. Accordingly, identification process 10 may include locating the common shapes of the shortest paths and then identifying the shapes adjacent to the common shapes. For each adjacent shape, identification process 10 may be configured to locate a known source of connectivity (e.g., a top level instance terminal). If a top level instance terminal is found, this adjacent shape defines a fork. Identification process 10 may locate the middle fork in order to efficiently reduce the common shapes by dichotomy.

In operation, and in conjunction with a graphical user interface, a user may select the middle fork from a plurality of forks. In response to the user selection, identification process 10 may visually emphasize the path from the fork to the closest instance, for example, using highlighting or any other suitable technique. Identification process 10 may also be configured to highlight the instance, show the instance and terminal names, and possibly select the instance for cross-probing in the schematic.

Additionally and/or alternatively, in some embodiments, identification process 10 may allow the user to select the net of an instance terminal. In response to the user selection, identification process 10 may add a virtual label on the instance, update the navigator to only show the forks that are left, and/or update the highlights for the common shapes.

Figure 8:
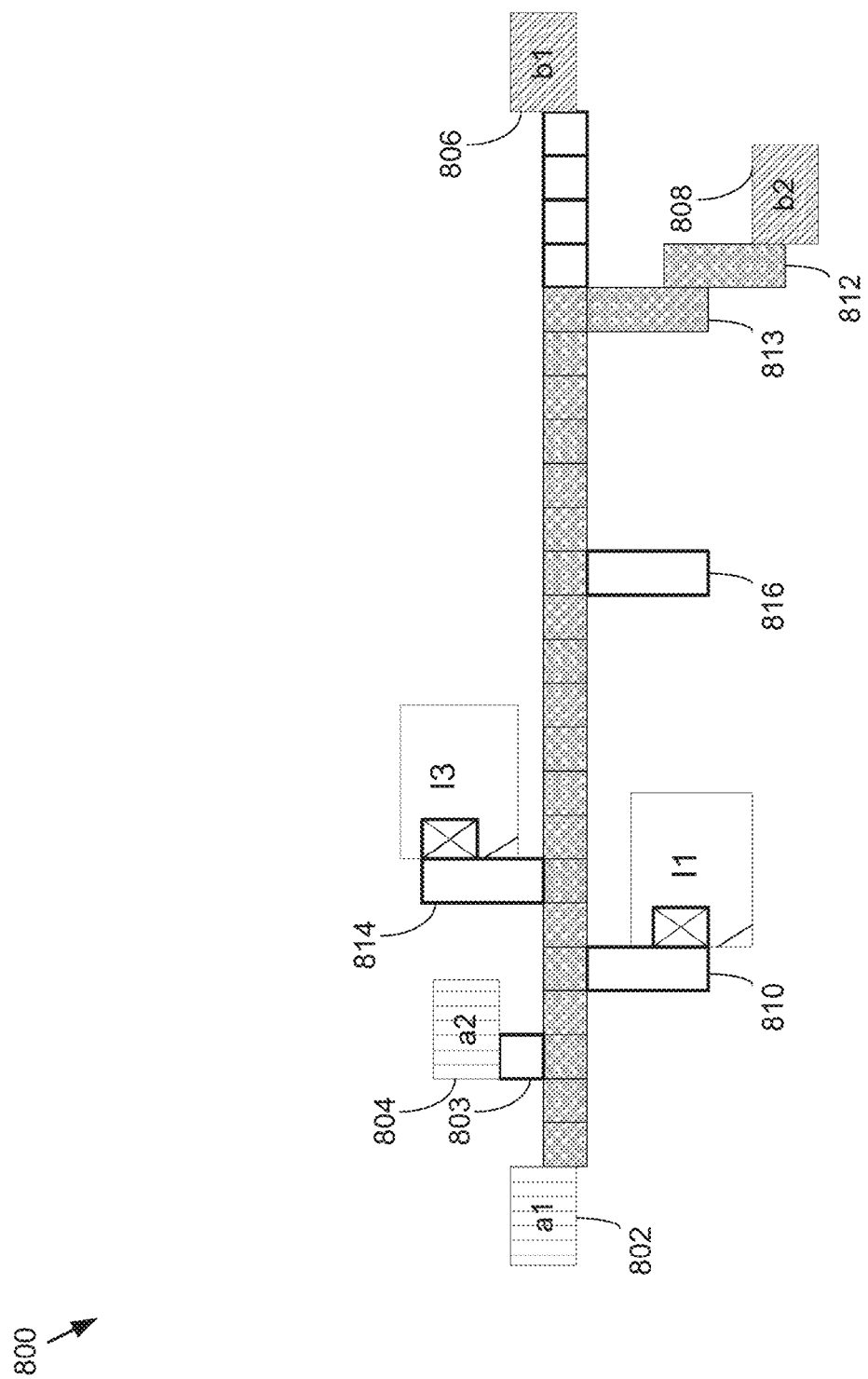
FIG. 8 is a diagram depicting aspects of the identification process in accordance with an embodiment of the present disclosure.
Figure 9:
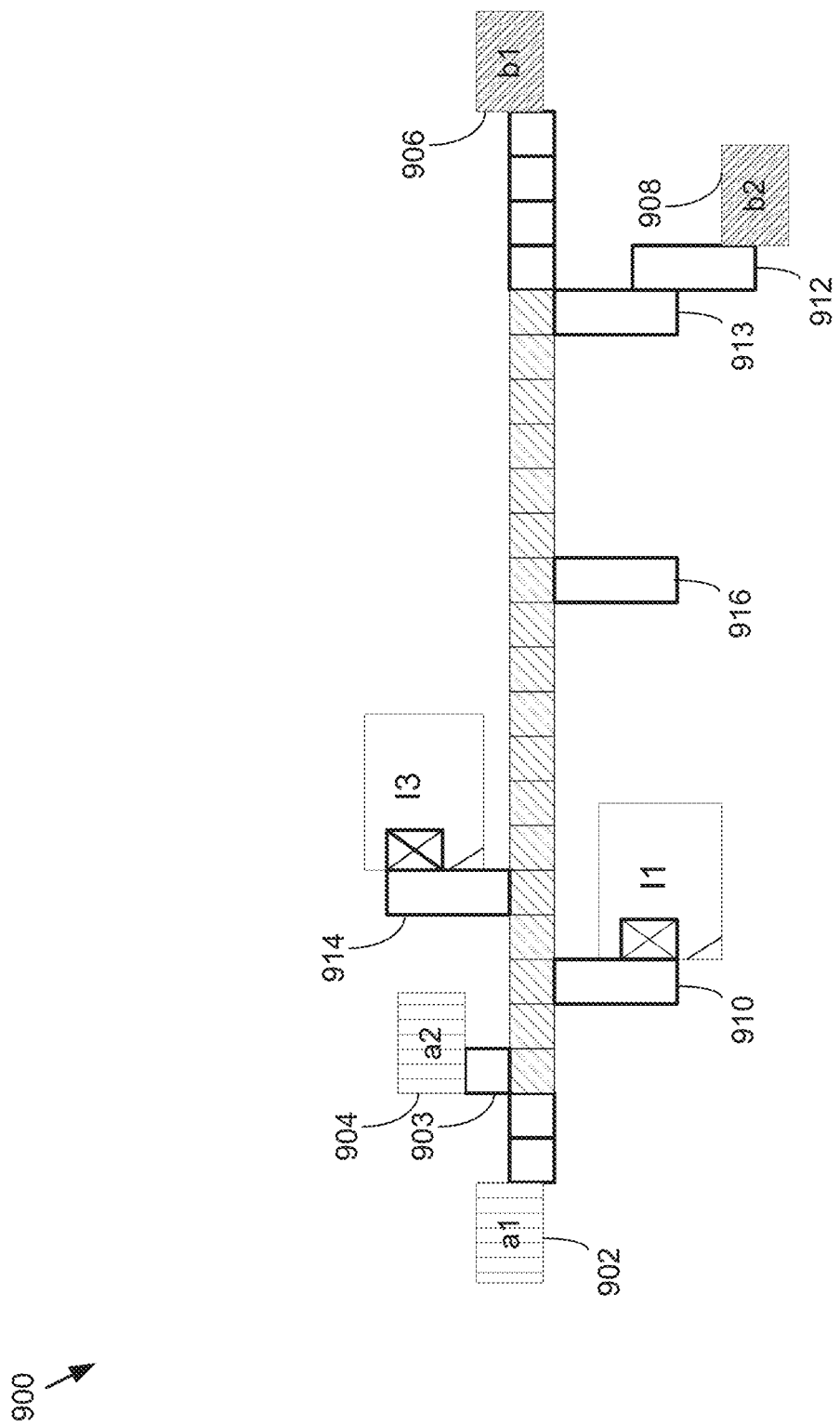
FIG. 9 is a diagram depicting aspects of the identification process in accordance with an embodiment of the present disclosure.
Figure 10:
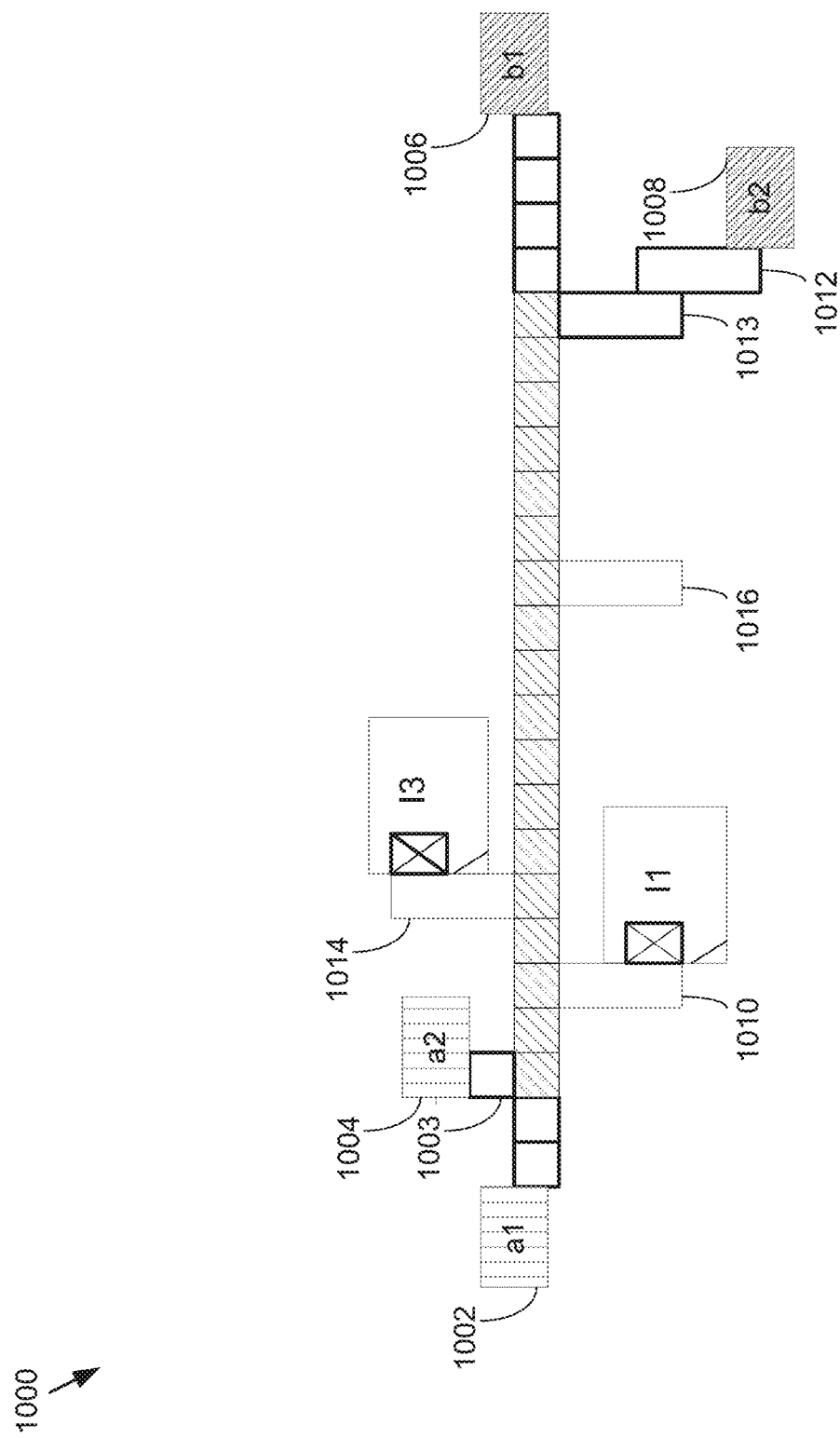
FIG. 10 is a diagram depicting aspects of the identification process in accordance with an embodiment of the present disclosure.

Referring now to FIGS. 7-10, additional embodiments consistent with identification process 10 are provided. In this particular example, there are two pins on net "a" and two pins on net "b". Accordingly, there are 2×2=4 shortest paths (e.g., a1 to b1, a1 to b2, a2 to b1, and a2 to b2). As is shown in FIG. 8, the shortest path between a1 and b2 is visually emphasized for the user. In some embodiments, the common shapes are the shapes that are common to all the shortest paths (in this particular example this is depicted by the hatching in FIG. 9). The adjacent shapes to the common shapes are shapes that are overlapping a common shape but that are not on a shortest path (e.g. 1010, 1014, and 1016 in FIG. 10). In this particular embodiment, reference numerals 1010 and 1014 are forks since these adjacent shapes each connect to a connectivity reference. Accordingly, 1016 is not a fork since this adjacent shape does not connect to a connectivity reference. In this example, the dichotomy would find one of the two forks. Its connectivity would be identified and depending upon which fork is selected and which net is found, either the short may be found immediately or the connectivity of the other fork must be analyzed to find the short.

Figure 11:
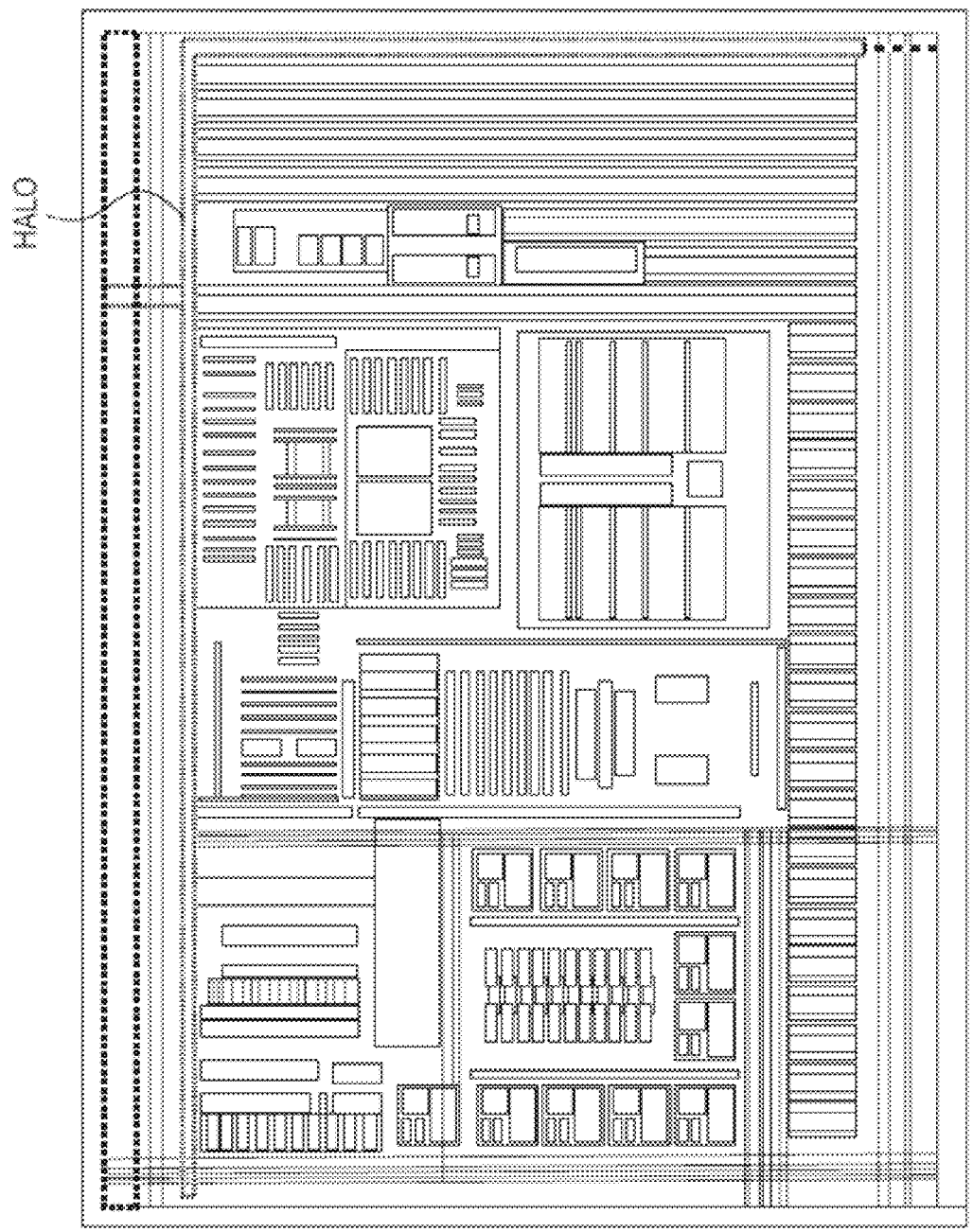
FIG. 11 is a diagram depicting aspects of the identification process in accordance with an embodiment of the present disclosure.
Figure 12:
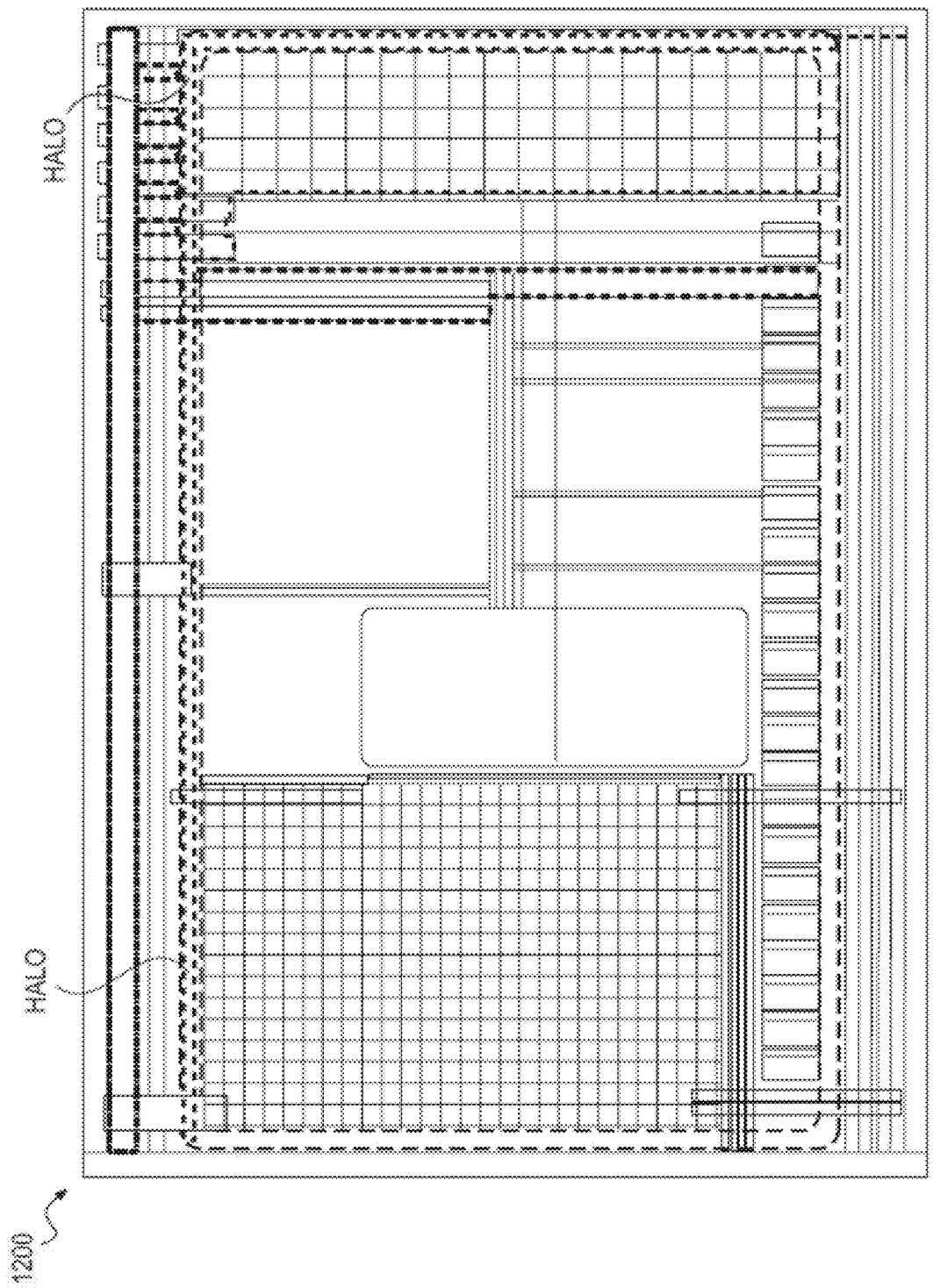
FIG. 12 is a diagram depicting aspects of the identification process in accordance with an embodiment of the present disclosure.
Figure 13:
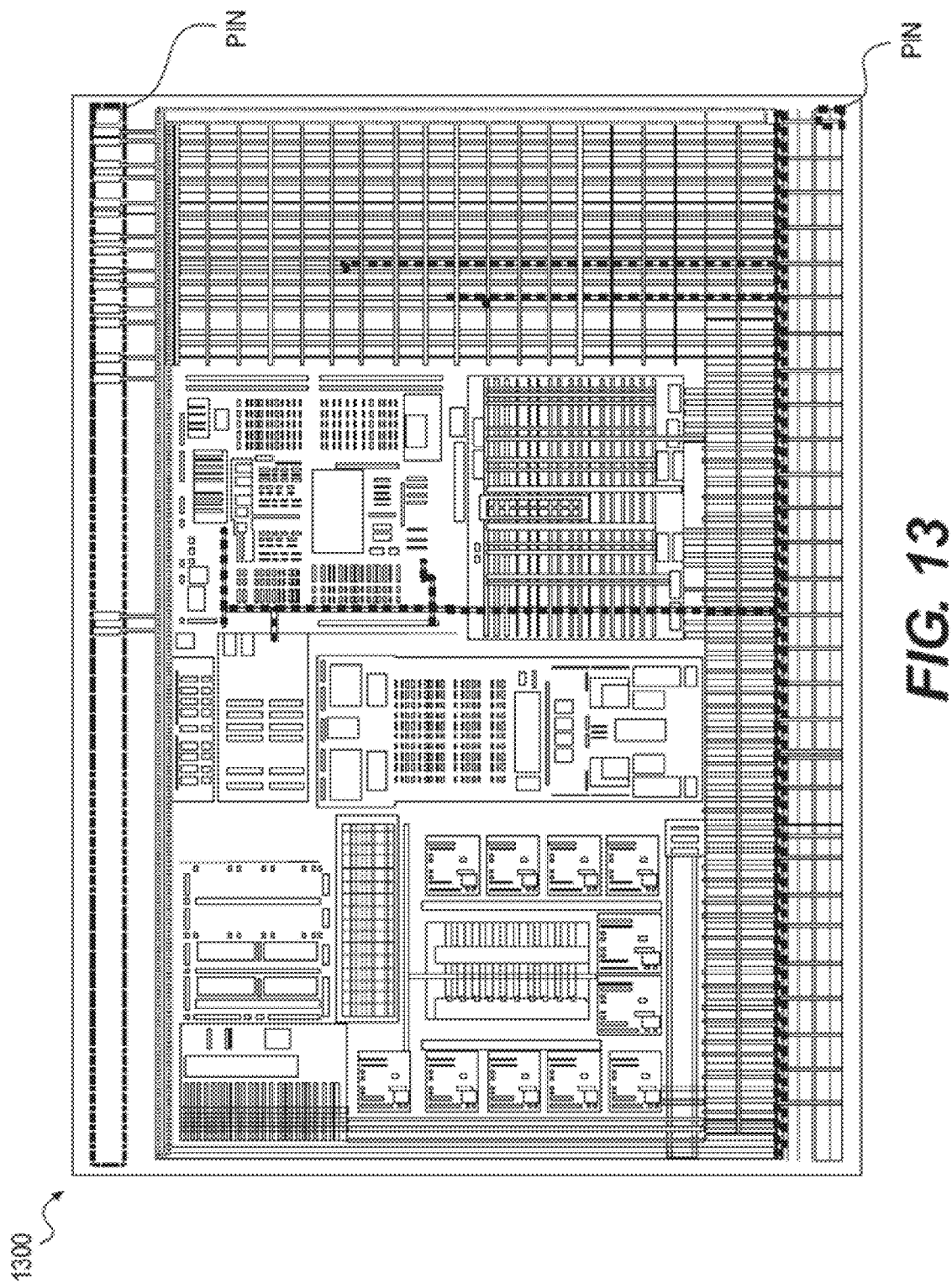
FIG. 13 is a diagram depicting aspects of the identification process in accordance with an embodiment of the present disclosure.
Figure 14:
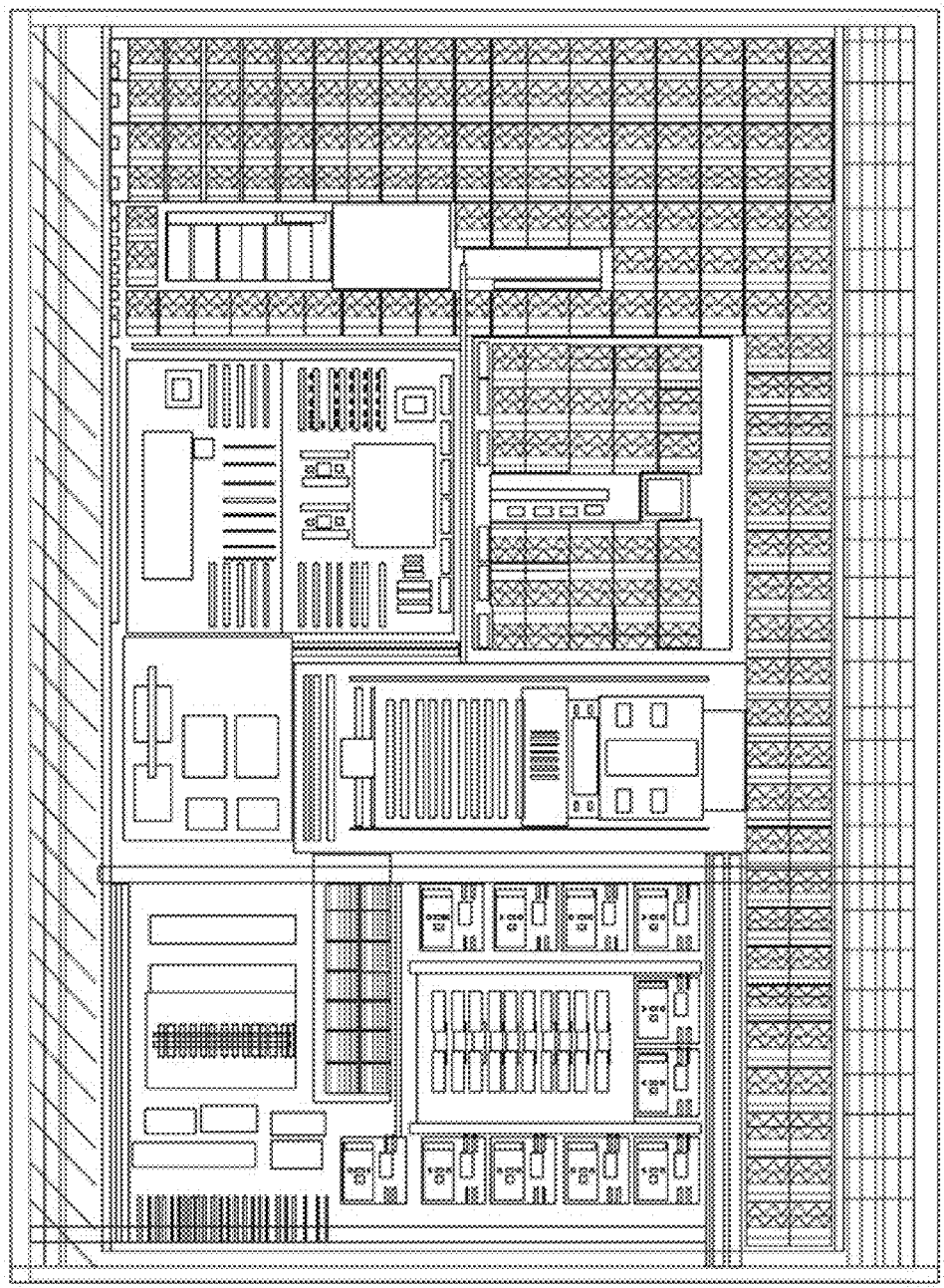
FIG. 14 is a diagram depicting aspects of the identification process in accordance with an embodiment of the present disclosure.
Figure 15:
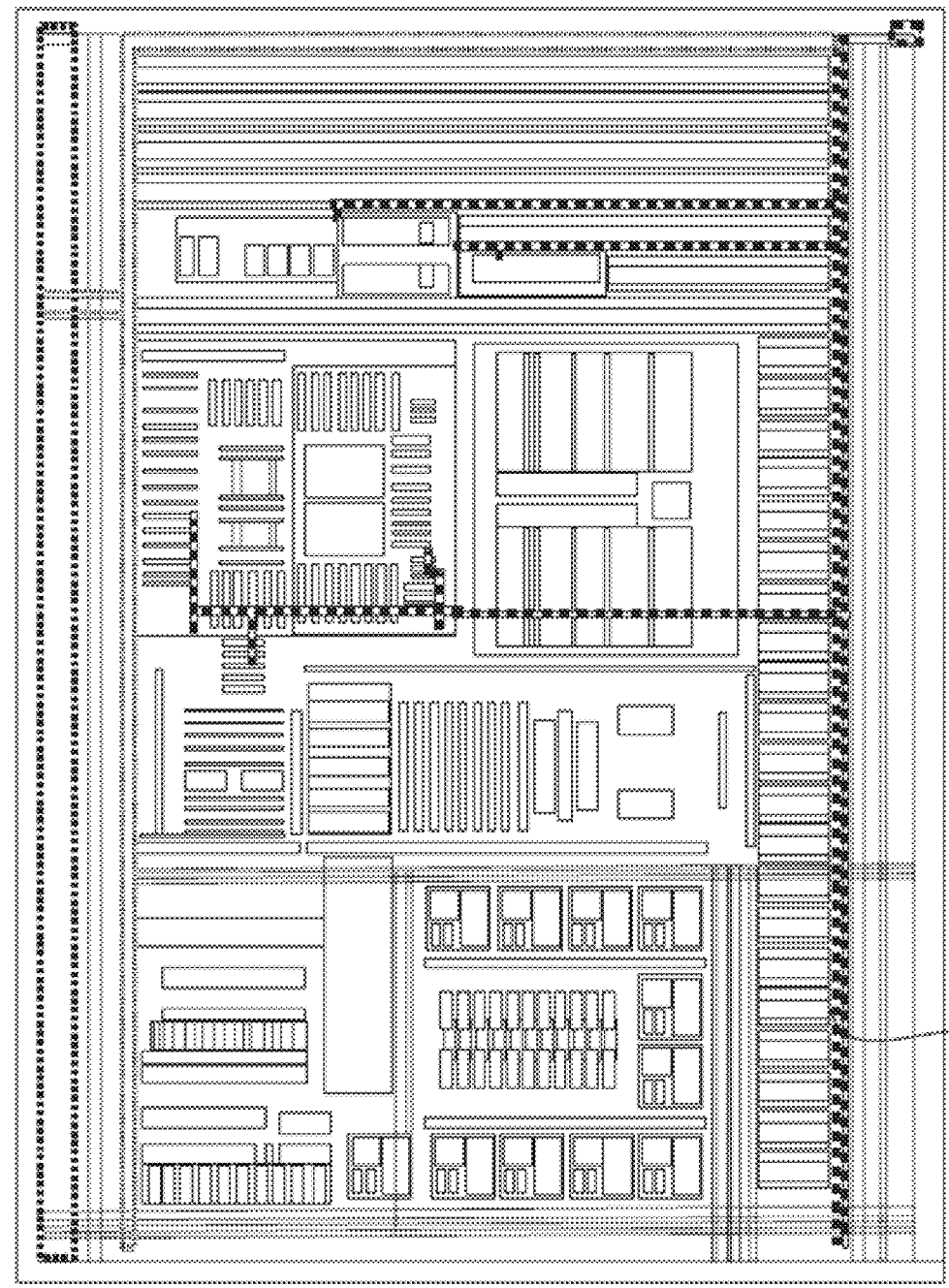
FIG. 15 is a diagram depicting aspects of the identification process in accordance with an embodiment of the present disclosure.

Embodiments depicting a plurality of graphical user interfaces consistent with identification process 10 are provided in FIGS. 11-15 shown below. FIG. 11 depicts a graphical user interface showing a visual emphasis on only the shapes common to all the shortest paths (depicted by the halo). FIG. 12 depicts a graphical user interface showing the shapes on the forked paths are also highlighted (depicted by the halo). FIG. 13 depicts a graphical user interface showing all the shapes connected to the two nets are highlighted. The rectangle in the upper left is a pin on net "VSS" and the rectangle in the upper right is a pin an net "VDD". FIG. 14 depicts a graphical user interface showing one view of the entire electronic design. FIG. 15 depicts a graphical user interface showing only the shortest paths are highlighted. The shapes highlighted are the ones that are detected to be on net "VDD".

In some embodiments, identification process 10 may be implemented using a navigator on the list of forks and connected devices. Accordingly, it may not be necessary to consider the layout to find the short location. As such, a user may work on a completely logical representation of the connectivity.

Figure 16:
FIG. 16 is a diagram depicting aspects of the identification process in accordance with an embodiment of the present disclosure.
Figure 17:
FIG. 17 is a diagram depicting aspects of the identification process in accordance with an embodiment of the present disclosure.

In some embodiments, and referring also to FIGS. 16-17, identification process 10 may be configured to display various aspects of the electronic design. For example, using the teachings of the proposed method, it may not be necessary to use the canvas. All of the information to find the short is logical and may be presented in a navigator, an example of which is shown in FIGS. 16-17. FIG. 16 depicts an example of a navigator for the short finder using an existing approach. It is a navigator on all the shapes of the shortest path containing the short.

FIG. 17 depicts an example consistent with the teachings of identification process 10 where the navigator only shows the forks on the common path. Accordingly, it should have many far fewer items than the navigator of FIG. 16. For example, each fork may include a list of connectivity references (e.g., one or more) in the form of an instance name and a terminal name. In operation, selecting a fork may highlight the corresponding shapes. Selecting a connectivity reference may highlight the instance in the layout and the bound instance in the schematic, if present. In some embodiments, it may be possible to go to the middle fork and then to associate it with the correct net (e.g., either VSS or VDD in this example). Identification process 10 may be configured to proceed to the middle fork of the forks that are still not associated with a net. Some or all of the operations associated with identification process 10 may then be performed through this navigator.

In some embodiments, EDA application 20 and/or identification process 10 may support a variety of languages and/or standards. EDA application 20 may support one or more software extensions, which may provide a high-throughput channel between the testbench and the device under test (DUT), and enable automated metric driven verification of embedded software exactly as if it were another part of the DUT.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method in an electronic design comprising:
    providing, using one or more computing devices, an electronic design including a first net and a second net;
    identifying a shortest path between the first net and the second net;
    determining at least one common shape associated with the shortest path;
    identifying one or more adjacent shapes to the at least one common shape;
    identifying at least one fork associated with each of one or more connectivity reference points, wherein the at least one fork is a shape on a path with an adjacent shape electrically-connected to at least one connectivity reference point; and
    analyzing an intermediate fork of the at least one fork to identify an electrical short associated with the electronic design.

2. The computer-implemented method of claim 1, wherein the at least one common shape corresponds to a device associated with the electronic design.

3. The computer-implemented method of claim 1, wherein the at least one fork is configured to connect the one or more connectivity reference points with the shortest path.

4. The computer-implemented method of claim 1, further comprising:
    displaying at least a portion of the electronic design in a navigator.

5. The computer-implemented method of claim 1, wherein the at least one fork includes a plurality of connectivity reference points.

6. The computer-implemented method of claim 4, wherein the navigator is configured to allow for a selection of the at least one fork.

7. The computer-implemented method of claim 6, further comprising:
    in response to the selection, visually emphasizing a path from the at least one fork to a nearest shape.

8. A non-transitory computer-readable storage medium having stored thereon instructions that when executed by a machine result in the following operations:
    providing, using one or more computing devices, an electronic design including a first net and a second net;
    identifying a shortest path between the first net and the second net;
    determining at least one common shape associated with the shortest path;
    identifying one or more adjacent shapes to the at least one common shape;
    identifying at least one fork associated with each of one or more connectivity reference points, wherein the at least one fork is a shape on a path with an adjacent shape electrically-connected to at least one connectivity reference point; and
    analyzing an intermediate fork of the at least one fork to identify an electrical short associated with the electronic design.

9. The computer-readable storage medium of claim 8, wherein the at least one common shape corresponds to a device associated with the electronic design.

10. The computer-readable storage medium of claim 8, wherein the at least one fork is configured to connect the one or more connectivity reference points with the shortest path.

11. The computer-readable storage medium of claim 8, further comprising:
    displaying at least a portion of the electronic design in a navigator.

12. The computer-readable storage medium of claim 8, wherein the at least one fork includes a plurality of connectivity reference points.

13. The computer-readable storage medium of claim 11, wherein the navigator is configured to allow for a selection of the at least one fork.

14. The computer-readable storage medium of claim 8, further comprising:
    in response to the selection, visually emphasizing a path from the at least one fork to a nearest shape.

15. A system comprising:
    one or more processors configured to provide an electronic design including a first net and a second net and identify a shortest path between the first net and the second net, the one or more processors further configured to determine at least one common shape associated with the shortest path and to identify one or more adjacent shapes to the at least one common shape, the one or more processors further configured to identify at least one fork associated with each of one or more connectivity reference points, wherein the at least one fork is a shape on a path with an adjacent shape electrically-connected to at least one connectivity reference point and to analyze an intermediate fork of the at least one fork to identify an electrical short associated with the electronic design.

16. The system of claim 15, wherein the at least one common shape corresponds to a device associated with the electronic design.

17. The system of claim 15, wherein the at least one fork is configured to connect the one or more connectivity reference points with the shortest path.

18. The system of claim 15, further comprising:
    displaying at least a portion of the electronic design in a navigator.

19. The system of claim 15, wherein the at least one fork includes a plurality of connectivity reference points.

20. The system of claim 18, wherein the navigator is configured to allow for a selection of the at least one fork.

* * * * *